United States Patent

(12) United States Patent
Oh

(10) Patent No.: US 10,872,665 B2
(45) Date of Patent: Dec. 22, 2020

(54) MEMORY DEVICE PERFORMING DATA COMPARISON WRITE AND MEMORY SYSTEM INCLUDING THE SAME

(71) Applicant: SAMSUNG ELECTRONICS CO., LTD., Suwon-si (KR)

(72) Inventor: Eun Chu Oh, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/545,765

(22) Filed: Aug. 20, 2019

(65) Prior Publication Data

US 2020/0185030 A1 Jun. 11, 2020

(30) Foreign Application Priority Data

Dec. 11, 2018 (KR) .................. 10-2018-0159038

(51) Int. Cl.
*G11C 11/00* (2006.01)
*G11C 13/00* (2006.01)
*G06F 11/10* (2006.01)

(52) U.S. Cl.
CPC ........ *G11C 13/0069* (2013.01); *G06F 11/102* (2013.01); *G11C 13/003* (2013.01); *G11C 13/004* (2013.01); *G11C 13/0038* (2013.01)

(58) Field of Classification Search
CPC . G11C 3/0069; G11C 13/003; G11C 13/0038; G06F 11/102

USPC .......................................... 365/148
See application file for complete search history.

(56) References Cited

U.S. PATENT DOCUMENTS

| | | | |
|---|---|---|---|
| 7,298,642 B2* | 11/2007 | Ise | G11C 11/1675 365/158 |
| 7,869,271 B2 | 1/2011 | Lee et al. | |
| 8,194,473 B2 | 6/2012 | Shin et al. | |
| 8,625,330 B2 | 1/2014 | Kim | |
| 8,848,465 B2 | 9/2014 | Kim et al. | |
| 9,153,332 B2 | 10/2015 | Lee et al. | |
| 9,384,831 B2 | 7/2016 | Taub et al. | |
| 2014/0016397 A1 | 1/2014 | Lee et al. | |
| 2015/0302925 A1 | 10/2015 | Oh et al. | |
| 2016/0240252 A1* | 8/2016 | Oh | G11C 13/0069 |

FOREIGN PATENT DOCUMENTS

KR 10-2014-0008702 A 1/2014

* cited by examiner

*Primary Examiner* — Vu A Le
(74) *Attorney, Agent, or Firm* — Lee IP Law, P.C.

(57) ABSTRACT

A memory device includes a memory cell array including a plurality of memory cells and a control logic to control a write operation on the memory cell array. When operating in a first data comparison write (DCW) mode, data is written to first memory cells in which data values are changed, in a first region, data is written to second memory cells in which data values are not changed, and, in a second region, data write is skipped for second memory cells in which data values are not changed.

20 Claims, 18 Drawing Sheets

(DCW_Mix MODE)

MEMORY DEVICE PERFORMING DATA COMPARISON WRITE AND MEMORY SYSTEM INCLUDING THE SAME

CROSS-REFERENCE TO RELATED APPLICATION

Korean Patent Application No. 10-2018-0159038, filed on Dec. 11, 2018, in the Korean Intellectual Property Office, and entitled: "Memory Device Performing Data Comparison Write and Memory System Including the Same," is incorporated by reference herein in its entirety.

BACKGROUND

1. Field

Embodiments relates to a memory device, and more particularly, to a memory device performing data comparison write and a memory system including the same.

2. Description of the Related Art

Resistive memory devices such as phase change random-access memory (RAM) (PRAM), nano-floating gate memory (NFGM), polymer RAM (PoRAM), magnetic RAM (MRAM), ferroelectric RAM (FeRAM), and resistive RAM (RRAM) are known as nonvolatile memory devices with flash memories. A resistive memory device has nonvolatile characteristics of a flash memory together with the high speed of dynamic RAM (DRAM).

The resistive memory device is capable of overwriting data in a memory cell by its characteristics. As an example, the resistive memory device may read previously-stored data for a cell region in which data is requested to be written, and by comparing the read data with the written data, may perform an actual write operation only for memory cells having different bit values from each other. Such a write operation may be referred to as a data comparison write (DCW) operation in that the write operation is executed based on a data comparison.

SUMMARY

One or more embodiments may provide a memory device having a memory cell array including a plurality of memory cells and a control logic to control a write operation on the memory cell array in a first data comparison write (DCW) mode. When operating in the first DCW mode, data is written to first memory cells in which data values are changed, in a first region, data is written to second memory cells of the plurality of memory cells in which data values are not changed, and in a second region, data is not written for second memory cells of the plurality of memory cells in which data values are not changed.

One or more embodiments may provide a memory device including a memory cell array including a plurality of pages, each page including a plurality of memory cells and a control logic to control a data write operation according to a mode selected from a data comparison write (DCW) on mode, a DCW off mode, and a DCW mix mode for the memory cell array. When the DCW mix mode is selected, the control logic is to write data according to the DCW off mode for a first region of memory cells of the plurality of memory cells of a first page to which a data write is requested and write data according to the DCW on mode for a second region of memory cells of the plurality of memory cell of the first page.

One or more embodiments may provide a memory system including a memory device including a memory cell array including a plurality of memory cells, a control logic to control data write and data read on the memory cell array, and a memory controller to control a memory operation of the memory device and provide the memory device with data comparison write (DCW) information for setting a write mode of the memory device. When a DCW mix mode is set as the write mode, the memory device is to write data to a first region of memory cells of the plurality of memory cells of the memory cell array according to a DCW off mode regardless of a change of a data value and to selectively write data according to a DCW on mode to a second region of memory cells of the plurality of memory cells of the memory cell array in which data values are changed.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
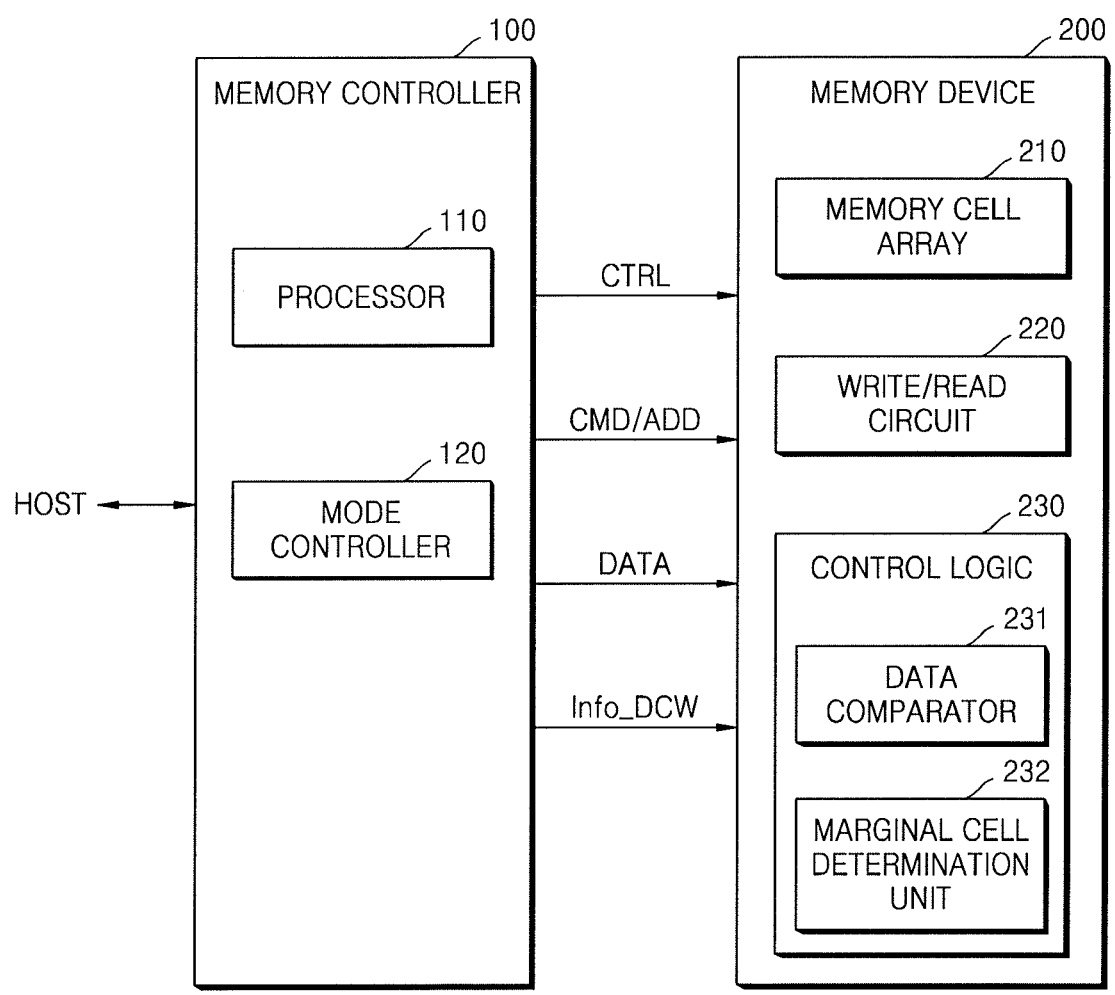
FIG. 1 illustrates a memory system including a memory device according to an embodiment.

FIG. 1 illustrates a memory system 10 including a memory device 200, according to an embodiment. In an embodiment, the memory device 200 may be referred to as a resistive memory device when the memory device 200 includes resistive memory cells. In implementations, the memory device 200 may include various types of memory cells. Since the memory cells are arranged where a plurality of first signal lines and a plurality of second signal lines intersect each other, the memory device 200 may be referred to as a cross-point memory device. In the following embodiments, the memory device 200 is assumed to be a resistive memory device, but may be a volatile memory device, a flash memory device, and the like.

The memory device 200 in FIG. 1 may be implemented in various forms. As an example, the memory device 200 may be a device implemented in one memory chip or a device including a plurality of memory chips. As an example, the memory device 200 may be a memory module having a plurality of memory chips mounted on a board. As another example, the memory device 200 may be implemented in various forms, e.g., such as a semiconductor package including one or more memory dies.

Referring to FIG. 1, the memory system 10 may include a memory controller 100 and the memory device 200. The memory device 200 may include a memory cell array 210, a write/read circuit 220, and a control logic 230. In addition, the memory controller 100 may include a processor 110 and a mode controller 120. The processor 110 of the memory controller 100 may control various memory operations in a manner that is based on hardware, software, or a combination thereof.

The memory controller 100 may control the memory device 200 to read data stored in the memory device 200 or to write data to the memory device 200 in response to a write/read request from a host HOST. The memory controller 100 may control a program (or a write) operation, a read operation, and an erase operation for the memory device 200, by providing an address ADD, a command CMD, and a control signal CTRL to the memory device 200. In addition, data DATA to be written and read data DATA may be transmitted and received between the memory controller 100 and the memory device 200.

The memory controller 100 may communicate with the host HOST through various protocols. For example, the memory controller 100 may be configured to communicate with the host HOST through at least one of various interface protocols such as universal serial bus (USB), multimedia card (MMC), peripheral component interconnect express (PCI-E), advanced technology attachment (ATA), serial-ATA, parallel-ATA, small computer system interface (SCSI), enhance small device interface (ESDI), integrated drive electronics (IDE), and the like.

The memory cell array 210 may include a plurality of memory cells respectively arranged at respective intersections of a plurality of first signal lines and a plurality of second signal lines. In an embodiment, the plurality of first signal lines may be a plurality of bit lines, and the plurality of second signal lines may be a plurality of word lines. In addition, each of the plurality of memory cells may be a single level cell (SLC) storing one bit or a multi level cell (MLC) capable of storing data of at least 2 bits. In addition, the memory cells may have a large number of resistance distributions, depending on the number of bits stored in each memory cell. For example, when data of one bit is written to one memory cell, the memory cells may have two resistance distributions, and when data of two bits is stored in one memory cell, the memory cells may have four resistance distributions.

The memory cell array 210 may include resistive memory cells including a variable resistive element. For example, when the variable resistance element has a resistance varying with temperature as a phase change material (germanium-antimony-tellurium (Ge—Sb—Te or GST)), the resistive memory device may be a phase-change random access memory (PRAM). As another example, when the variable resistance element includes complex metal oxide arranged on a top electrode, a bottom electrode, and therebetween, the memory controller 100 may be a resistive random access memory (RRAM). As another example, when the resistive memory device includes a top electrode of a magnetic material, a bottom electrode of a magnetic material, and a dielectric material therebetween, the resistive memory device may be a magnetoresistive random access memory (MRAM).

The memory device 200 may support the data comparison write (DCW) mode in which data is selectively written only to some of the memory cells based on data comparison. For example, the memory device 200 may be set to a DCW off DCW-OFF mode or a DCW on DCW-ON mode. The control logic 230 may include a data comparator 231. When a write mode of the memory device 200 is set to the DCW on DCW_ON mode, previously-stored data may be read from the cell region from which the data write is requested, and then, by comparing the read data with the data to be written in the cell region, the data comparator 231 may determine memory cells where data values are changed by the write (or bit values or logic states are different) operation. In addition, the control logic 230 may control the write operation such that an actual write operation is performed only for the memory cells in which data values are changed.

On the other hand, when the write mode of the memory device 200 is set to the DCW off DCW OFF mode, the actual write operation may be performed on all the memory cells in the cell region regardless of the data values for the cell region to which the data write is requested. According to an operation example, the type of the DCW mode set in the memory device 200 may be selected by the memory controller 100, and the mode controller 120 may provide the memory device 200 with DCW information Info_DCW denoting the type of the DCW mode.

When the DCW on DCW_ON mode is set, and a write request of identical data values is received in some of the memory cells, the actual write operation may not be performed on the some of the memory cells. In this case, while the reliability of data is increased by compensating for disturbance, resistance shift, etc., for the memory cells in which the actual write operation is performed, the memory cells in which the actual write operation is not performed may be weak memory cells in which a possibility of error occurrence in the future is high due to various reasons, e.g., disturbance, resistance shift, etc. Such memory cells of low reliability may have a low read margin and may be referred to as marginal cells.

According to an example embodiment, the memory device 200 may operate in the DCW on DCW_ON mode and the DCW off DCW OFF mode as well as another DCW mode. For example, a DCW mix DCW_MIX mode may be set for the memory device 200. In the DCW mix DCW_MIX mode, the write operation may be performed on some of the memory cells of the memory cell array 210, e.g., memory cells in a first region) based on the DCW off DCW_OFF mode, while the write operation is performed on others of the memory cell array 210, e.g., memory cells in a second region, based on the DCW on DCW_ON mode. For example, the mode controller 120 may provide the memory device 200 with the DCW information Info_DCW to set the DCW mix DCW_MIX mode.

Below, an operation example of the DCW mix DCW_MIX mode according to example embodiments is described. In describing an embodiment, an example is described in which a page is defined as a write unit, a first region and a second region are set for the memory cells in the page, and a different DCW mode is applied to each region. As another example, the memory cells of various different units may be defined, and the first region and the second region may be set in which different DCW modes are applied to the memory cells of the various different units.

According to an embodiment, some of the memory cells of the page may be set to the first region and the remaining memory cells may be set to the second region. In addition, as the write request for the page is received, the actual write operation may be performed on all the memory cells based on the DCW off DCW_OFF mode for the first region of the page. On the other hand, the actual write operation is not performed on the memory cells in which the read data values and the written data values are identical in the second region based on the DCW on DCW_ON mode for the second region of the page, the write operation may be selectively performed on the memory cells in which data values are different from each other.

As an operation example, the control logic 230 may include a marginal cell determining unit 232, and when the DCW mix DCW_MIX mode is set, the marginal cell determining unit 232 may determine some of the memory cells among the memory cells to be written as marginal cells. In addition, according to a determination result, the memory cells determined as the marginal cells in the page may be included in the first region.

The marginal cells may be determined according to various methods of assessing whether cells have a high possibility of error occurring. For example, the memory cells that have relatively poor resistance distribution characteristics among the memory cells of the page may be determined to be marginal cells and are included in the first region. On the other hand, the memory cells which are not determined to be marginal cells may be included in the second region.

In the memory device 200, the data reliability of the marginal cells may be relatively low, such that data of the marginal cells may be lost over time. When the memory device 200 is set to the DCW on DCW_ON mode, and the write request of identical data for the marginal cells is received, actual data may not be written for the marginal cells. Accordingly, data of at least some of the memory cells may be lost. In other words, when data of an actually identical bit value is rewritten to the memory cells, the resistance distribution characteristics of the corresponding memory cells may be improved. However, since the data of the identical bit value is not written when operating in the DCW on DCW_ON mode, data loss may occur in the marginal cells.

On the other hand, since the marginal cells having relatively poor resistance distribution characteristics are determined according to an example embodiment, and the DCW off DCW_OFF mode is applied to the marginal cells in the first region, the actual data write operation may be performed on the marginal cells regardless of the data value. Thus, since the write operation based on the DCW off DCW_OFF mode is performed on the cells in the first region, the reliability of data stored in marginal cells may be prevented from being degraded.

On the other hand, the write operation may be performed on the memory cells in the second region based on the DCW on DCW_ON mode, and accordingly, the write operation may be selectively performed only on the memory cells having different values of the read data and written data, and the actual write operation may be skipped for memory cells having an identical data value. Accordingly, the number of memory cells in which the actual data is written in the cell region of the write unit may be reduced compared with the DCW off DCW_OFF mode, and time, power consumption, etc. required for the data write operation may be reduced.

According to the embodiment described above, the memory cells of the page to which data write is requested may include first memory cells in which data values are changed according to data write and second memory cells in which data values are not changed, and data may be written for the first memory cells. In addition, the actual write operation may be performed in the memory cells included in the first region as some of the second memory cells in which data values are not changed, and data of the identical bit value may be rewritten in the some of the second memory cells. On the other hand, the data write operation may be skipped in the remaining memory cells among the second memory cells, i.e., those memory cells in the second region.

Although it has been described that the marginal cells are included in the first region in the above-described embodiment, various modifications of the embodiment may be possible. As an example, memory cells in which errors occur or there is a possibility of error occurrence determined according to other methods may be further included in the first region. In other words, the memory cells having the relatively low data reliability may be determined according to various methods, and the memory system 10 may be implemented to include the memory cells determined by at least one method in the first region.

The memory controller 100 and the memory device 200 may be implemented as separate semiconductor devices or may be integrated into one semiconductor device. Illustratively, the memory controller 100 and the memory device 200 may be integrated into one semiconductor device to form a memory card. For example, the memory controller 100 and the memory device 200 may be integrated into a single semiconductor device and may form a personal computer memory card international association (PCMCIA) card, a compact flash (CF) card, a smart media card (SMC), a memory stick, a multimedia card (MMC), reduced size (RS) MMC (RS-MMC), MMCmicro, a secure digital (SD) card, miniSD, microSD, a universal flash (UFS) memory, or the like.

Figure 2:
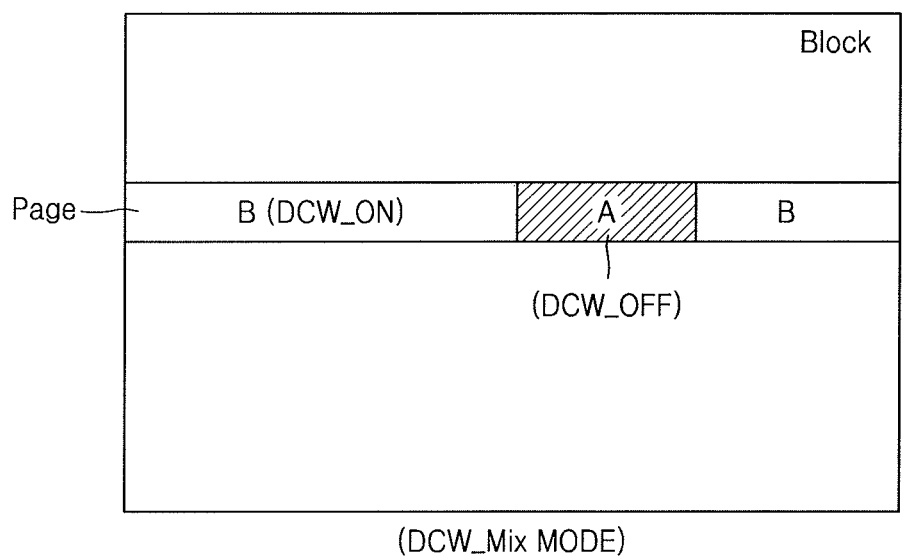
FIG. 2 illustrates an example in which a first region and a second region are set for each page.

FIG. 2 illustrates an example in which the first region and the second region are set for each page. Referring to FIGS. 1 and 2, the memory cell array 210 may include a plurality of cell blocks and FIG. 2 illustrates any one cell block. The cell block may include a plurality of pages and the data write operation may be performed in units of pages.

When operating in the DCW mix DCW_MIX mode, during the write operation on the page, some of the memory cells of the page may be included in a first region A, and the remaining memory cells may be included in a second region B. According to the above-described embodiment, the marginal cells may be included in the first region A. Data may be written in the memory cells of the first region A according to the DCW off DCW_OFF mode. Accordingly, all the write operations may be performed on the memory cells of the first region A regardless of the bit values of the read data and written data. Thus, in some of the memory cells of the first region A, data having the same bit values as the currently stored data may be rewritten.

On the other hand, in the memory cells of the second region B, data may be written according to the DCW on DCW_ON mode. Accordingly, the actual write operation may be performed only on some of the memory cells of the second region B in which the values of the read data and written data are different from each other. Accordingly, the actual write operation may not be performed on some of the memory cells of the second region B.

Figure 3A:
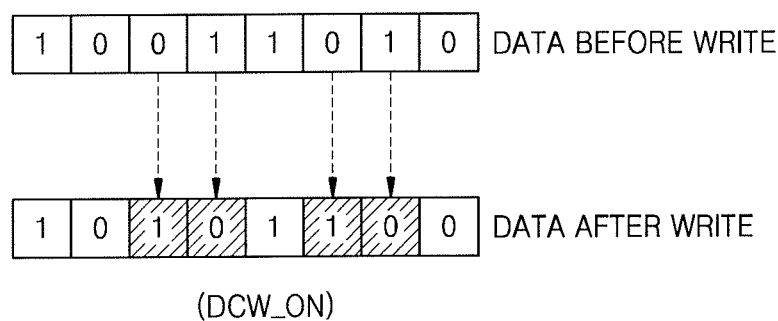
FIGS. 3A and 3B illustrate examples of writing data in the cases where a data comparison write (DCW) on mode and a DCW mix mode are set, respectively.
Figure 3B:
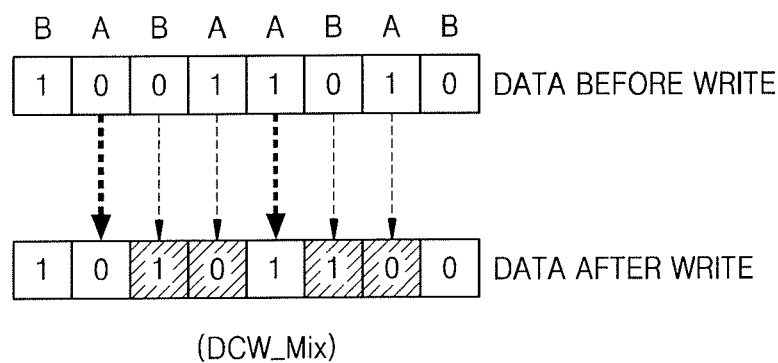

FIGS. 3A and 3B illustrate examples of data write in the cases where the DCW on DCW_ON mode and the DCW mix DCW_MIX mode are set, respectively. In FIGS. 3A and 3B, bit values of data before and after write in memory cells in a certain region (for example, memory cells of a page) are shown. Accordingly, a bit value of data before write may correspond to a value of the read data, and a bit value of data after write may correspond to a value of the written data. In addition, in FIGS. 3A and 3B, the actual memory operation may be performed on some memory cells indicated by arrows in the pages.

Referring to FIG. 3A, a memory device may be set to the DCW on DCW_ON mode based on an internal control or a control of a memory controller. Accordingly, a read operation may be performed for a write-requested page, and the values of the read data and written data may be compared with each other. According to a comparison result, the memory cells having different values of the read data and the written data may be determined, and the write operation may be selectively performed only on the determined memory cells.

Referring to FIG. 3B, the memory device may be set to the DCW mix DCW_MIX mode based on an internal control or a control of the memory controller 100, and a read operation may be performed on the write-requested page, and the marginal cells may be determined in the page through an analysis operation for the read data. Here, the marginal cells may be included in the first region A and the remaining memory cells may be included in the second region B.

According to an embodiment, the write operation may be performed on the memory cells of the first region A, based on the DCW off DCW_OFF mode, and accordingly, the actual write operation may be performed on all the memory cells of the first region A regardless of data values. On the other hand, the write operation may be performed on the memory cells of the second region B based on the DCW on DCW-ON mode, and accordingly, the write operation may be selectively performed only on the memory cells having different values of the read data and written data.

Figure 4:
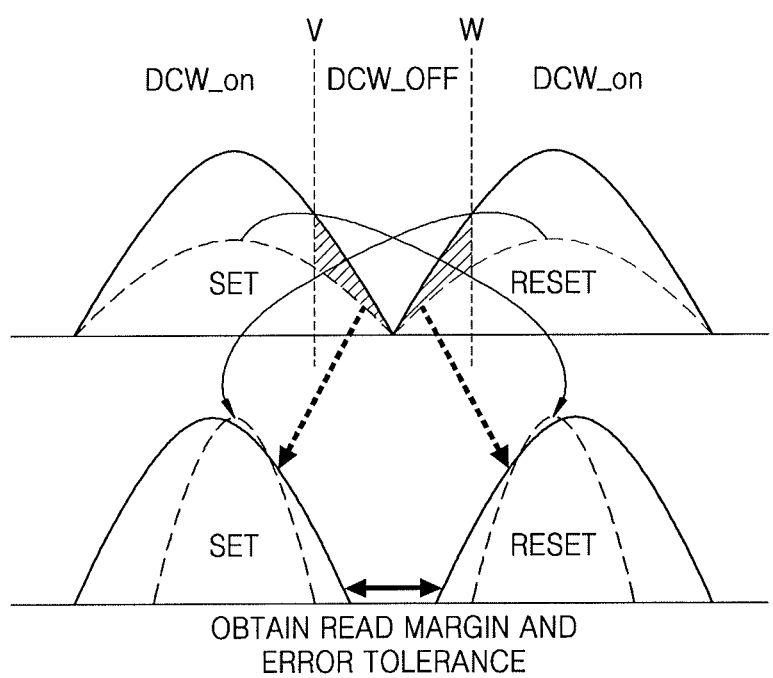
FIG. 4 illustrates graphs of examples of changes in resistance distribution during a write operation according to a DCW mix mode.

FIG. 4 illustrates graphs of examples of changes in resistance distribution during the write operation according to the DCW mix DCW_MIX mode. In FIG. 4, an example is illustrated in which data of one bit is written in each memory cell, and thus the memory cells of the page have two resistance distributions. In addition, in the graphs of FIG. 4, the horizontal axis represents a resistance level and the vertical axis represents the number of memory cells.

Referring to FIG. 4, the memory cells may have a set state SET or a reset state RESET according to the bit value of data. The reset state RESET may have a resistance level greater than the set state SET. The memory cells having a resistance level approximately halfway between the resistance level of the set state SET and the resistance level of the reset state RESET may be determined as the marginal cells which have a low data reliability. In FIG. 4, an example is illustrated in which memory cells having resistance levels between a resistance value V and a resistance value W are determined as the marginal cells.

The memory cells at the set state SET having a resistance level less than the resistance value V may be included in the second region described above, and accordingly, the write operation may be selectively performed only on the memory cells of the second region in which data is to be written at a different logic state (for example, the reset state RESET). In addition, the memory cells at the reset state RESET having a resistance level greater than the resistance value W may be included in the second region described above, and accordingly, the write operation may be selectively performed only on the memory cells of the second region in which data is to be written at a different logic state (for example, the set state SET).

On the other hand, for the marginal cells having resistance levels between the resistance values V and W, the write operation may be performed based on the DCW off DCW_OFF mode. Referring to FIG. 4, an example is illustrated in which data is rewritten at the set state SET for the marginal cells at the set state SET and data is rewritten at the reset state RESET for the marginal cells at the reset state RESET.

According to the example embodiment as described above, the write operation may be performed according to the DCW mix DCW_MIX mode on the memory cells in the cell region of the write unit, and accordingly, the resistance distribution characteristic may be improved to ensure the read margin. In other words, the reliability of data may be improved by the write operation according to the DCW mix DCW_MIX mode, and the possibility of error occurrence may be reduced.

Figure 5A:
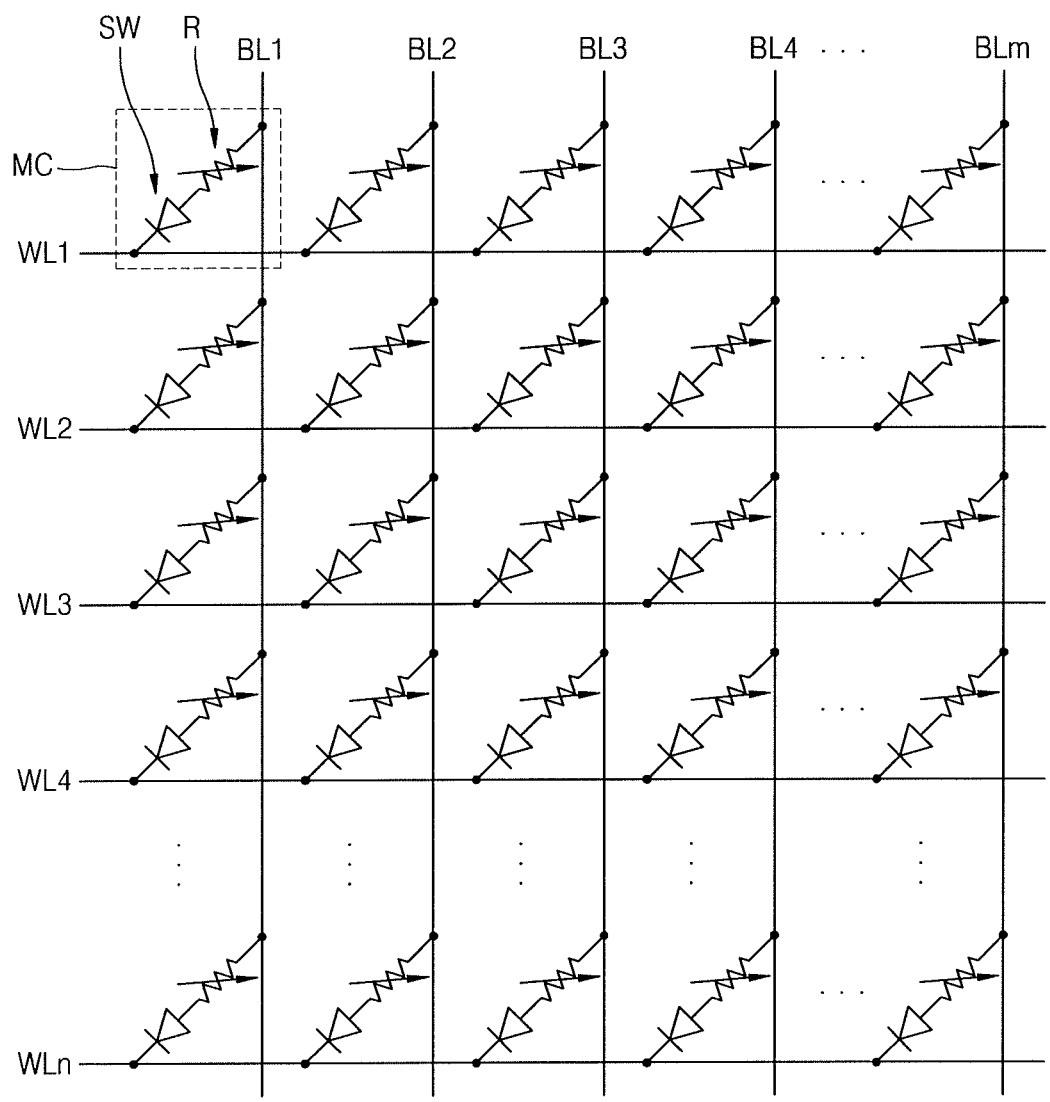
FIGS. 5A and 5B illustrate circuit diagrams as an example of a memory cell array in FIG. 1.
Figure 5B:
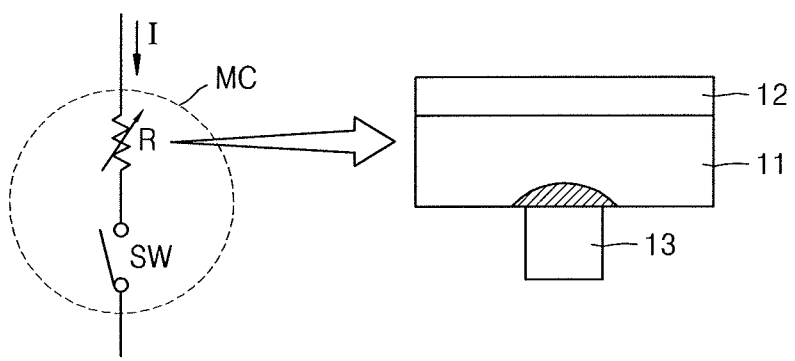

FIGS. 5A and 5B are circuit diagrams illustrating an implemented example of the memory cell array 210 in FIG. 1. In FIGS. 5A and 5B, a case is illustrated where the resistive memory cell includes PRAM. In addition, the memory cell array 210 illustrated in FIG. 5A corresponds to one cell block.

The memory cell array 210 may be a two-dimensional memory cell array having a horizontal structure and include first through $n^{th}$ word lines WL1 through WLn, first through $m^{th}$ bit lines BL1 through BLc, and a plurality of memory cells MC. The memory cell array 210 may include a plurality of memory blocks. In each memory block, the plurality of memory cells MC may be arranged in rows and columns. Here, the number of word lines WL, the number of bit lines BL, and the number of memory cells MC may be variously changed. In an implementation, the memory cell array 210 may be a three-dimensional memory cell array having a vertical structure.

According to the embodiment, each of the plurality of memory cells MC may include a variable resistive element R and a switching element SW. Here, the variable resistance element R may be referred to as a variable resistance material and the switching element SW may be referred to as a selection element.

In one embodiment, the variable resistance element R may be connected between one of the first through $m^{th}$ bit lines BL1 through BLm and the switching element SW, and the switching element SW may be connected between the variable resistance element R and one of the first through $n^{th}$ word lines WL1 through WLn. Alternatively, the switching element SW may be connected between one of the first through $m^{th}$ bit lines BL1 through BLm and the variable resistance element R, and the variable resistance element R may be connected to the switching element SW and one of the first through $n^{th}$ word lines WL1 through WLn.

The switching element SW may be connected between any one of the first through $n^{th}$ word lines WL1 through WLn and the variable resistance element R and may control a current supply to the variable resistance element R according to a voltage applied to the connected word line WL and the connected bit line BL. In FIG. 5A, the switching element SW is illustrated as a diode, but may be any appropriate switchable element.

Referring to FIG. 5B, the memory cell MC may include a variable resistance element R and the switching element SW. The switching element SW may be implemented by using various elements such as a transistor and a diode. The variable resistive element R may include a phase change layer 11 including a mixture of germanium, antimony, and tellurium mixture (Ge—Sb—Te or GST), a top electrode 12 on the phase change layer 11, and a bottom electrode 13 under the phase change layer 11.

The top and bottom electrodes 12 and 13 may include various metals, metal oxides, metal nitrides, or the like. The top and bottom electrodes 12 and 13 may include aluminum (Al), copper (Cu), titanium nitride (TiN), titanium aluminum nitride (TixAlyNz), iridium (Ir), platinum (Pt), gold (Au), poly silicon, tungsten (W), titanium (Ti), tantalum (Ta), tantalum nitride (TaN), tungsten nitride (WN), nickel (Ni), cobalt (Cr), antimony (Sb), iron (Fe), molybdenum (Mo), palladium (Pd), tin (Sn), zirconium (Zr), zinc (Zn), iridium oxide ($IrO_2$), strontium oxide zirconate ($StZrO_3$), or the like.

The phase change layer 11 may include a bi-polar resistance memory material or a uni-polar resistance memory material. The bi-polar resistive memory material may be programmed to a set state or a reset state by polarity of a current, and Perovskite materials may be used for the bi-polar resistive memory material. The uni-polar resistance memory material may be programmed to the set or reset state by a current of identical polarity, and a transition metal oxide, e.g., NiOx, TiOx, or the like, may be used for the uni-polar resistance memory material.

The GST material may be programmed between an amorphous state having a relatively high resistivity and a crystalline state having a relatively low resistivity. The GST material may be programmed by heating. A magnitude and duration of heating may determine whether the GST material remains in the amorphous or crystalline state. The high resistivity and low resistivity may be represented by programmed values of logic "0" and logic "1", respectively, and may be detected by measuring the resistivity of the GST material. Conversely, the high resistivity and low resistivity may be represented by the programmed values of logic "1" and logic "0", respectively.

Referring to FIG. 5B, when a write current I is applied to the memory cell MC, the applied write current I may flow through the bottom electrode 13. When the write current I is applied to the memory cell MC for a very short time, the applied write current may generate heat, or Joule's heat, only to an adjacent layer of the bottom electrode 13. At this time, due to a difference in heating profile, some of the phase change layer 11 may become in the crystalline state (or the set state SET) or the amorphous state (or the reset state RESET).

Figure 6:
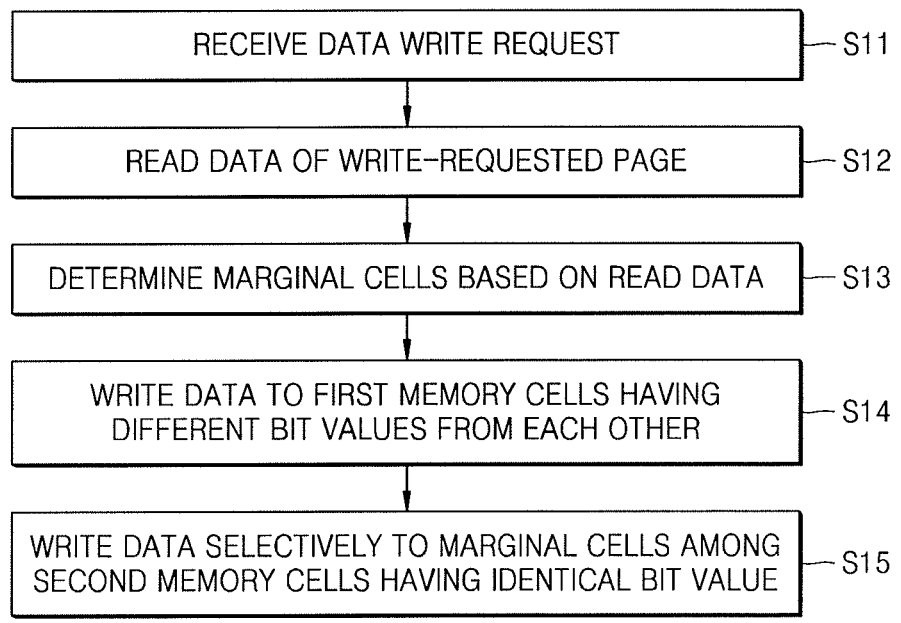
FIGS. 6 and 7 illustrate flowcharts of methods of operation of a memory device, respectively, according to example embodiments.
Figure 7:
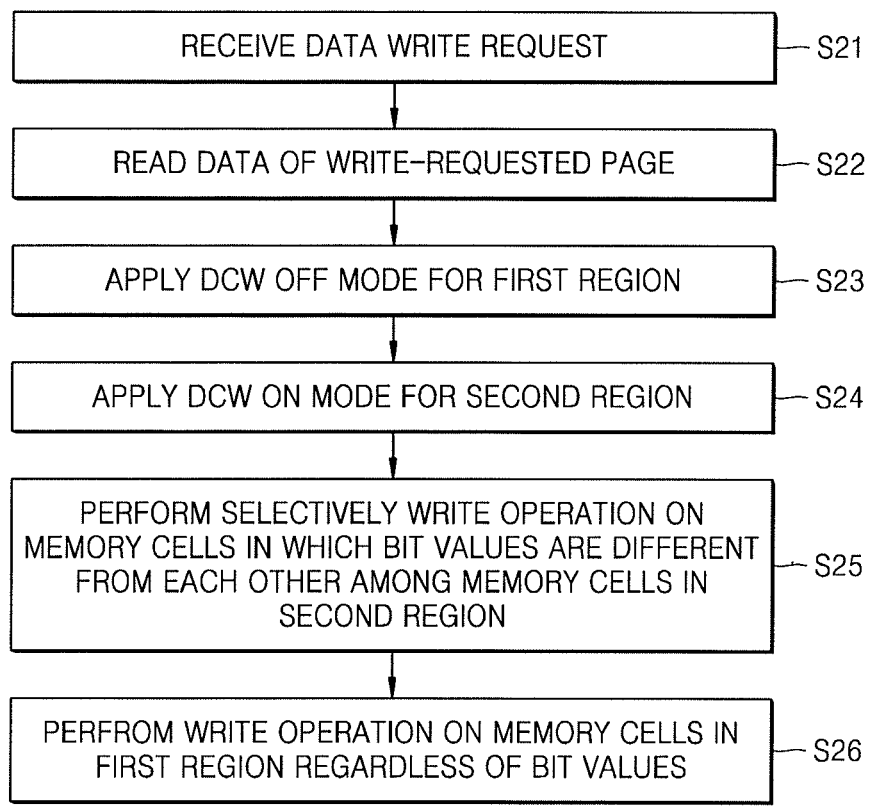

FIGS. 6 and 7 are flowcharts of methods of operation of a memory device, respectively, according to example embodiments.

Referring to FIG. 6, the write mode of the memory device is set to the DCW mix DCW_MIX mode according to example embodiments. First, the memory device may receive a data write request from a memory controller (S11). As an example, the memory device may receive a write command from the memory controller, an address denoting a cell region where the write is to be performed, and the write data. As described above, when a data write is performed page by page, the address may include an address indicating a page.

The memory device may read data of the page indicated by the received address (S12) and determine one or more memory cells as marginal cells based on the read data (S13). One or more read operations may be performed on a write-requested page for determining the marginal cells, and two read operations (or sensing operations) may be performed as an operation example. In addition, according to the above-described embodiments, the memory cells having relatively poor resistance distribution characteristics may correspond to the marginal cells.

The memory device may compare the read data with the write data and write data to first memory cells in which data values are changed (S14). In addition, the memory device may determine memory cells corresponding to the marginal cells among second memory cells, for the second memory cells in which data values are not changed, may perform an actual write operation on the memory cells corresponding to the marginal cells of the second memory cells, and may skip the write operation on the memory cells not corresponding to the marginal cells (S15).

On the other hand, referring to FIG. 7, the memory device may be set to the DCW mix DCW_MIX mode according to the example embodiments and may perform the write operation according to operations illustrated in FIG. 7. According to the operations illustrated in FIG. 7, a substantially identical result to a result of the above-described write operation in FIG. 6 may be generated. In other words, a process for performing any one of the write requests according to the DCW mix DCW_MIX mode may be described in various types of operations.

Referring to FIG. 7, the memory device may receive the data write request from the memory controller (S21) and read data of a cell region (for example, a page) indicated by the address received in the data write request (S22). In addition, according to the above-described embodiments, one or more of the marginal cells may be determined based on the read data, and the marginal cells may be included in a first region while the remaining memory cells are included in a second region.

The DCW off DCW_OFF mode may be applied to the first region of the page (S23), and in addition, the DCW on DCW_ON mode may be applied to the second region of the page (S24). Accordingly, the memory device may selectively perform the actual write operation only on the memory cells among the memory cells of the second region in which data values are changed (S25). In addition, the memory device may perform the write operation on all the memory cells of the first region regardless of the data values (S26).

Figure 8A:
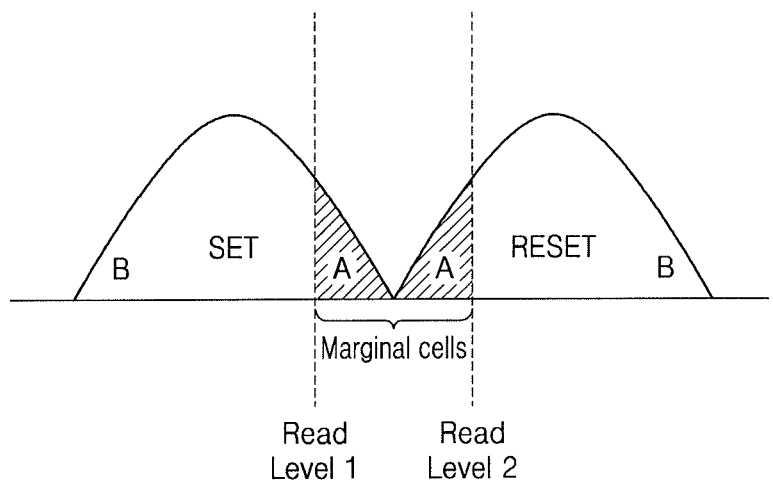
FIGS. 8A and 8B illustrate examples of determining marginal cells, respectively.
Figure 8B:
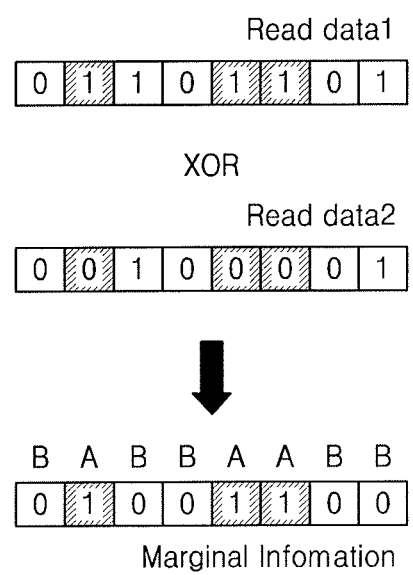

FIGS. 8A and 8B are diagrams illustrating examples of determining the marginal cells, respectively. FIGS. 8A and 8B illustrate examples in which the memory cells have two resistance distributions, but embodiments may be used with memory cells have more than two resistance distributions.

Referring to FIG. 8A, logic states of memory cells of the write-requested page may have the set state SET and the reset state RESET, and for the write-requested page, a first read operation using a first read level (Read Level 1) and a second read operation using a second read level (Read Level 2) may be performed. Data read according to the first read operation may be referred to as first read data, and data read according to the second read operation may be referred to as second read data.

Based on the first read data and the second read data, the marginal cells having a resistance level between the first read level and the second read level may be determined, and the determined marginal cells may be included in the first region A. In addition, the remaining memory cells except for the marginal cells may be included in the second region B. For example, the write-requested memory cells of the cell region in which a bit value read in the first read operation and a bit value read in the second read operation are different from each other may be determined as the marginal cells.

Referring to FIG. 8B, marginal information may be generated that represents the marginal cells among the memory cells based on a comparison result of the first read data with the second read data. As an example, an exclusive OR (XOR) operation may be performed on the first read data and the second read data. When the bit value of the first read data and the bit value of the second read data are different from each other, the memory cells having "1" as a result of the XOR operation may be determined as the marginal cells. Based on the marginal information, the memory cells of the first region A may be determined in which the data write is to be performed according to the DCW off DCW_OFF mode.

According to one embodiment, the marginal information illustrated in FIG. 8B may be generated in a control logic (or a marginal region determination unit) in the embodiments described above. In addition, a control logic in the memory device may control the write operation such that all data is written by referring to the marginal information regardless of the data values for the memory cells in the first region A. In addition, the control logic may determine the memory cells in which, by referring to the comparison result of values of the read data and the write data, data values are different from each other, and may control the write operation for the memory cells not included in the first region A such that data is selectively written for the memory cells in which the data values are different from each other.

Figure 9:
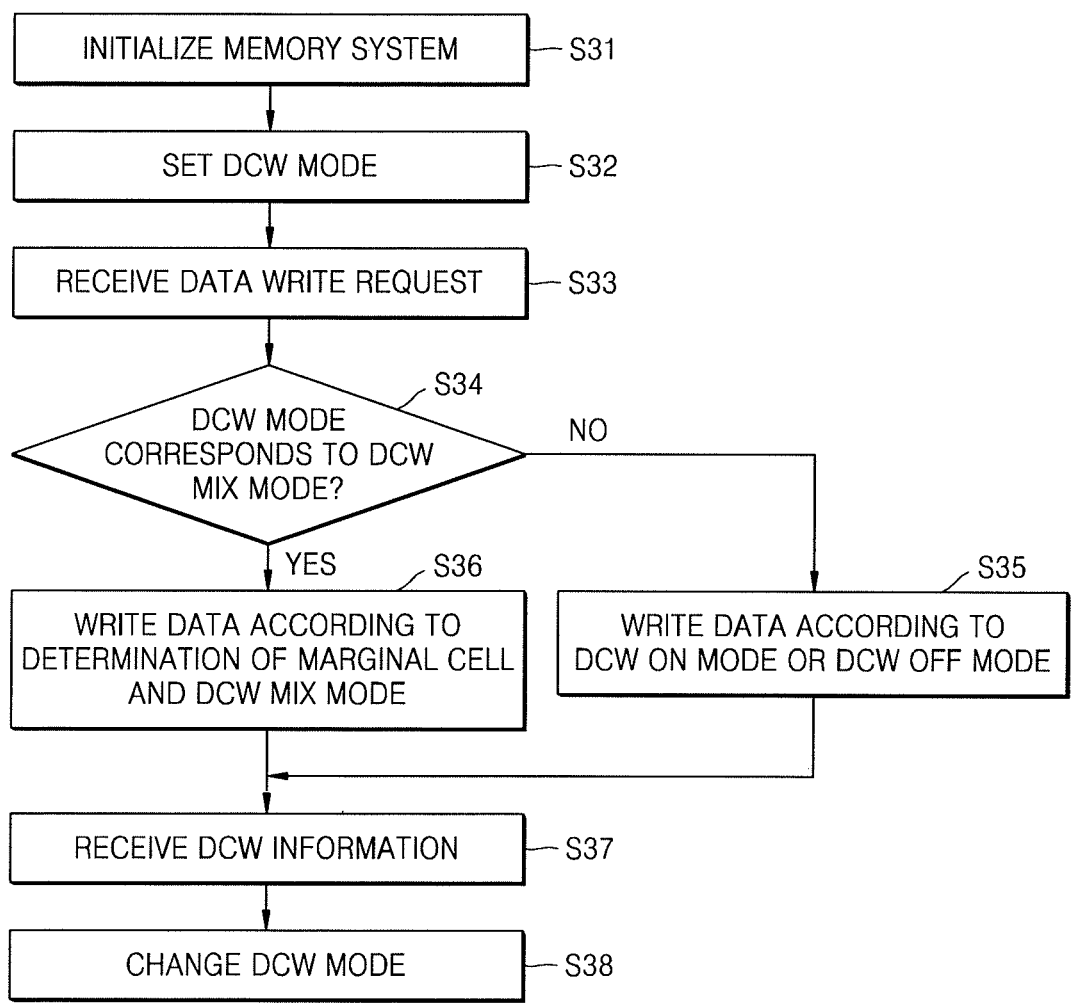
FIGS. 9 and 10 illustrate flowcharts of methods of operation of a memory system, respectively, according to example embodiments.
Figure 10:
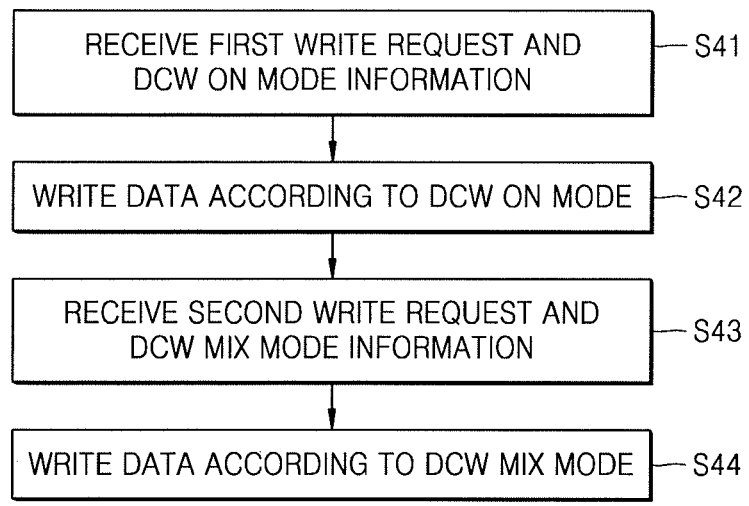

FIGS. 9 and 10 are flowcharts of methods of operation of a memory system, respectively, according to example embodiments. The memory system may include a memory controller and a memory device.

As the memory system is initialized (S31), various information about setting of a memory operation may be transmitted and received between the memory controller and the memory device. As an example, the memory controller may set the DCW mode of the memory device by providing the DCW information to the memory device (S32), and the memory controller may set the DCW mode of the memory device to any one of the DCW on DCW_ON mode, the DCW off DCW_OFF mode, and the DCW mix DCW_MIX mode.

The memory device may receive the data write request from the memory controller (S33) and may determine whether an existing DCW mode corresponds to the DCW mix DCW_MIX mode (S34). When the existing DCW mode does not correspond to the DCW mix DCW_MIX mode, the memory device may operate in either the existing DCW on DCW_ON mode or the DCW off DCW_OFF mode and perform the data write operation according to the existing DCW mode (S35).

On the other hand, when the existing DCW mode corresponds to the DCW mix DCW_MIX mode, the memory device may determine the marginal cells in the page to which the data write request has been requested according to the above-described embodiments, and in addition, may perform the data write operation based on the DCW mix DCW_MIX mode (S36). For example, the data write operation may be performed on the marginal cells regardless of changes of the data values.

On the other hand, the DCW mode of the memory device may be changed based on the control of the memory controller. As an example, the memory controller may transmit the DCW information to the memory device to change the DCW mode of the memory device, and the memory device may receive the DCW information (S37) and change the DCW mode according to the received DCW information (S38).

Referring to FIG. 10, the memory device may set the DCW mode for each write operation according to the DCW information received together with the write request from the memory controller. As an example, the memory device may receive information about the DCW on DCW_ON mode indicating that data is to be written according to the DCW on DCW_ON mode for the first page when a first write request is received for the first page from the memory controller (S41).

The memory device may write data to the first page according to the DCW on DCW_ON mode (S42), and as an example, may selectively perform the write operation only on the memory cells MC in which data values are changed by comparing the read data read from the first page with the write data.

Next, the memory device may receive information about the DCW mix DCW_MIX mode indicating that data is to be written according to the DCW mix DCW_MIX mode for the second page when a second write request is received for the second page from the memory controller (S43). The memory device may determine the memory cells in which data values are different from each other by comparing the read data read from the second page with the write data. In addition, the memory device may determine the marginal cells in the above-described embodiment through one or more read operations for the second page, and based on the comparison result of the data values and the determination result of the marginal cells, may write data to the second page according to the DCW mix DCW_MIX mode (S44).

The operations included in the embodiments described below may all be performed in a memory device or a memory controller, or some operations in each embodiment may be performed in the memory device and other operations may be performed in the memory controller.

Figure 11:
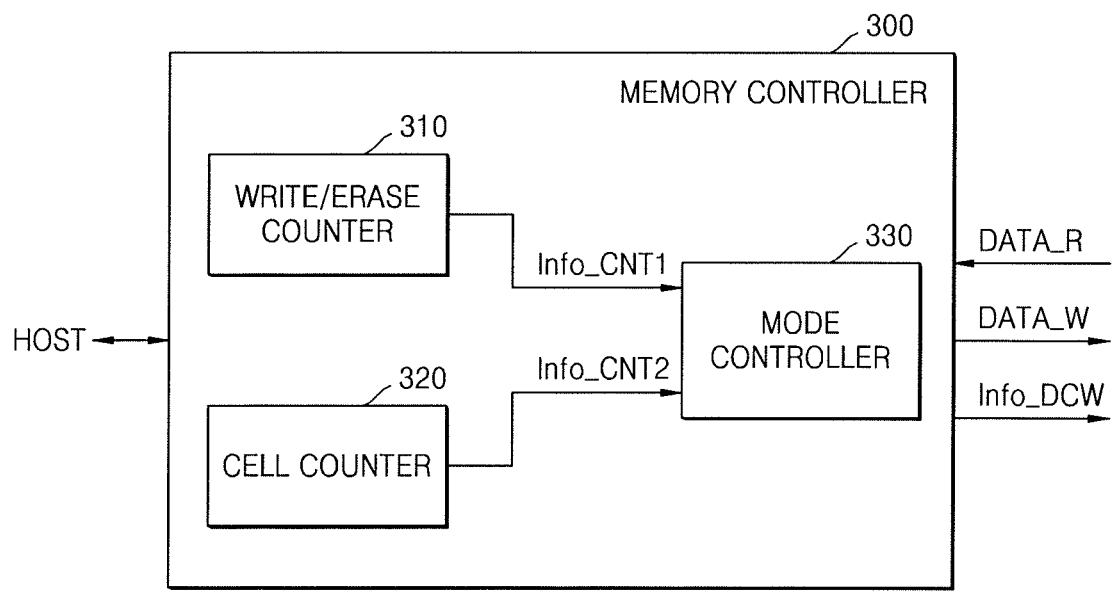
FIGS. 11, 12A, and 12B illustrate examples of operations of a memory system at various DCW modes based on counting operations, respectively.
Figure 12A:
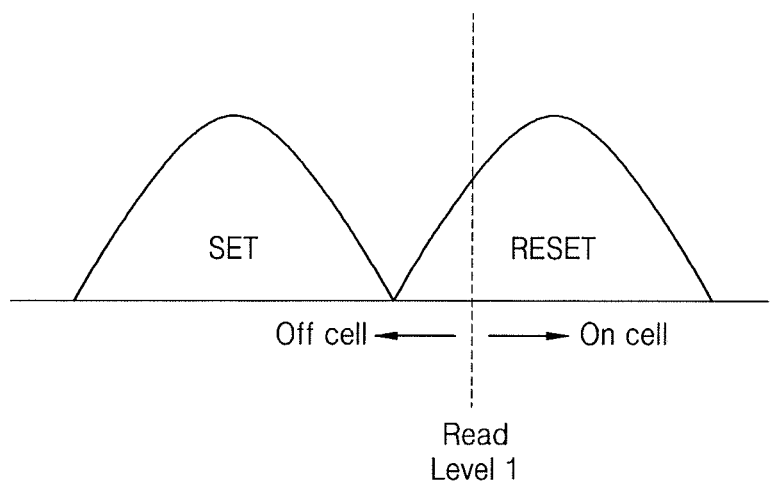
Figure 12B:
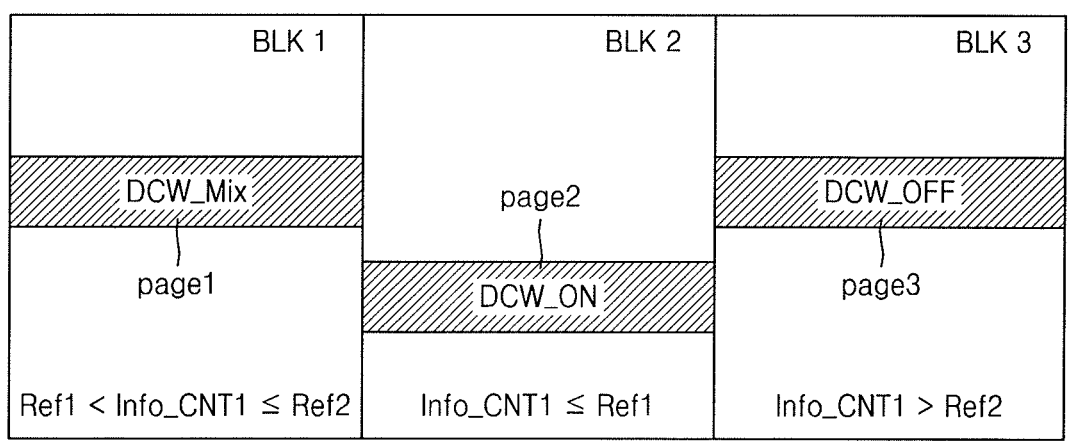

FIGS. 11, 12A, and 12B are diagrams illustrating examples of operations of a memory system at various DCW modes based on counting operations, respectively.

Referring to FIG. 11, the memory controller 300 may include a write/erase counter 310, a cell counter 320, and a mode controller 330. The memory controller 300 may control a write/erase operation for a memory device in response to a request from the host HOST, and the write/erase counter 310 may count the number of writes and/or erases for each of certain regions of the memory cell array. Assuming that the write/erase counter 310 counts the number of writes, the write/erase counter 310 may count the number of writes in units of cell blocks or pages. In addition, the record/erase counter 310 may output first counting information Info_CNT1 according to a counting result.

The cell counter 320 may perform a cell counting operation on the read data read from the memory device. As an example, the cell counter 320 may count the number of off-cells (or on-cells) of the page by counting data of a certain logic state from read data DATA_R read from a certain read unit (for example, a page) and output a second counting information Info_CNT2 according to a result thereof. The mode controller 330 may output DCW information Info_DCW based on the first counting information Info_CNT1 and the second counting information Info_CNT2.

When the first counting information Info_CNT1 of the write/erase counter 310 has a relatively large value (or exceeds a certain reference value), the first counting information Info_CNT1 may indicate that a life of a first page or a cell block including the first page to which the write is requested is not long and that the durability of the first page is deteriorated. The mode controller 330 may select the DCW mode for the first page based on the first counting information Info_CNT1 and output the DCW information Info_DCW according to a selection result thereof.

In addition, as the durability of the first page is degraded, the resistance distribution characteristics of the first page may be degraded. For example, the resistance distributions of the memory cells of the first page may be shifted in one direction or the width of the resistance distributions may be enlarged. At this time, in the case where the number of off-cells (or on-cells) of the first page exceeds a certain reference value, it may be understood that the resistance distributions of the first page are shifted, and accordingly, the resistance distribution characteristics of the first page are poor. The mode controller 330 may select the DCW mode for the first page based on the second counting information Info_CNT2 and output the DCW information Info_DCW according to a selection result thereof.

The memory controller 300 may provide write data DATA_W with the data write request to a memory device, and the memory device may perform the write operation by using the write data DATA_W based on the DCW information Info_DCW from the memory controller 300.

In the example embodiment illustrated in FIG. 11, the mode controller 330 may output the DCW information Info_DCW based on various combinations of the first counting information Info_CNT1 and the second counting information Info_CNT2. As an example, when one or both the first counting information Info_CNT1 and the second counting information Info_CNT2 for the first page satisfies the DCW mix DCW_MIX mode condition, data may be written to the first page according to the DCW mix DCW_MIX mode.

In the example embodiment in FIG. 11, it is illustrated that the mode controller 330 combines the first counting information Info_CNT1 and the second counting information Info_CNT2. In an implementation example, the mode controller 330 may selectively receive the first counting information Info_CNT1 or the second counting information Info_CNT2, and based on the received information, a memory system may be implemented such that the DCW information Info_DCW is output.

In the embodiment illustrated in FIG. 11, the DCW information Info_DCW may be provided to the memory device for each write request. Alternatively, the memory device may set the DCW mode according to the DCW information Info_DCW provided from the memory controller 300 and perform the data write according to the set DCW mode. When the DCW information Info_DCW is changed, the DCW mode may be changed according to the DCW information Info_DCW.

FIG. 12A illustrates an example in which the data of the first page is read according to a certain read level (for example, a first read level Red Level 1), and the data read according to the first read level may be provided to the memory controller 300. In one example, the cell counter 320 of the memory controller 300 may count the number of off-cells having a resistance value less than the first read level, or may output the second counting information Info_CNT2 that indicates a result of counting the number of on-cells having a resistance value greater than the first read level.

On the other hand, FIG. 12B illustrates an example in which the number of write/erase operations is counted in units of cell blocks, and accordingly, the DCW mode is set differently in units of cell blocks. When the write/erase counter 310 is assumed to count the number of writes, the write/erase counter 310 may generate the first counting information Info_CNT1 for each of a first cell block BLK 1, a second cell block BLK 2, and a third cell block BLK3.

As the first counting information Info_CNT1 indicating the number of writes of the second cell block BLK2 is less than a first reference value Ref1, the memory cells of the second cell block BLK2 may have relatively better resistance distribution characteristics than the other memory cells of the other cell blocks, and the DCW on DCW_ON mode may be set for the second cell block BLK2. Accordingly, when the write request is received for the second page included in the second cell block BLK2, the write operation may be performed on the second page according to the DCW on DCW ON mode.

On the other hand, as the first counting information Info_CNT1 indicating the number of writes of the first cell block BLK1 is greater than the first reference value Ref1 and less than a second reference value Ref2, it may be determined that the first cell block BLK1 has relatively poorer resistance distribution characteristics than the second cell block BLK 2. Accordingly, the DCW mix DCW_MIX mode may be set for the first cell block BLK 1, and when the write request for the first page included in the first cell block BLK 1 is received, a marginal region may be determined from the first page, and all data may be written for the memory cells of the marginal region according to the DCW off DCW_OFF mode regardless of the data value.

On the other hand, as the first counting information Info_CNT1 indicating the number of writes of the third cell block BLK3 is greater than the second reference value Ref2, it may be determined that the cell block BLK3 has poorer resistance distribution characteristics than the first cell block BLK1. Accordingly, the DCW off DCW_OFF mode may be set for the third cell block BLK 3, and when the write request for a third page included in the third cell block BLK 3 is received, the write operation may be performed on the third page according to the DCW off DCW_OFF mode.

FIG. 12B illustrates an example in which the DCW mode is set differently for each cell block, but the embodiment is not limited thereto. As an example, when the write/erase counting operation is performed for each page, the DCW mode may be set differently for each page based on the number of writes/erases of each page, for pages included in the same cell block.

FIGS. 13 and 14A through 14C are diagrams illustrating examples in which determination of the marginal region in the above-described embodiments is performed in a memory system 400, respectively.

Figure 13:
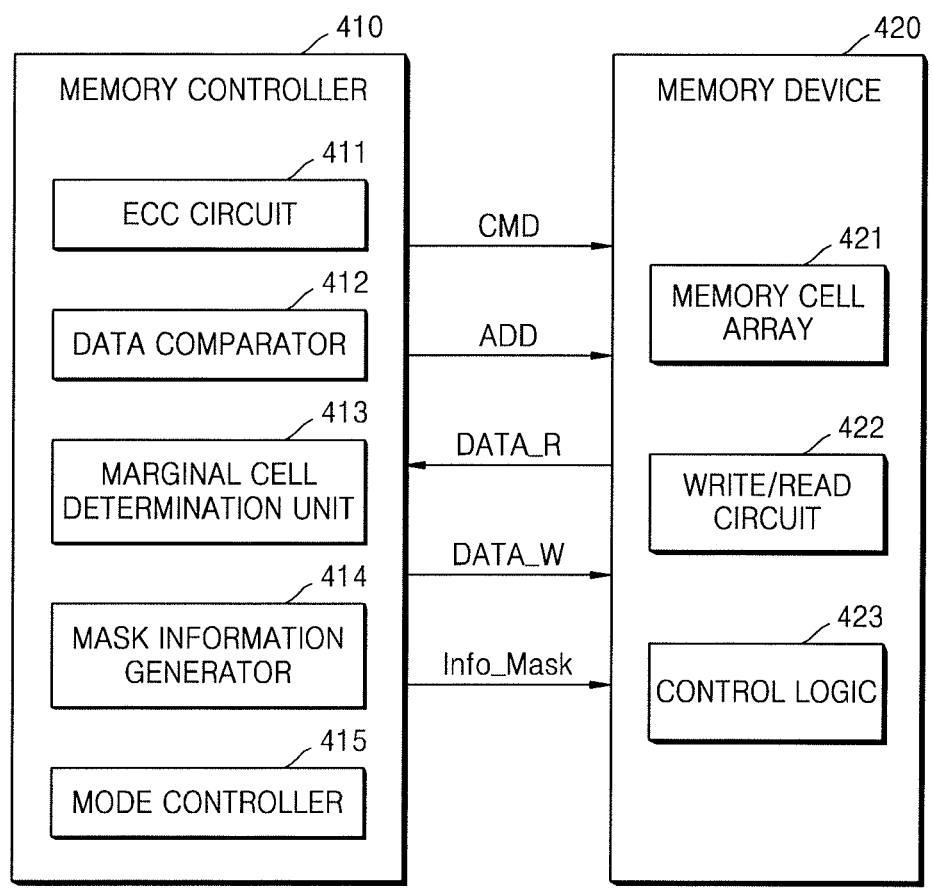
FIGS. 13, and 14A through 14C illustrate examples in which determination of a marginal region in the above-described embodiments is performed in a memory controller, respectively.

Referring to FIG. 13, the memory system 400 may include a memory controller 410 and a memory device 420, and the memory controller 410 may include an error correction code (ECC) circuit 411, a data comparator 412, a marginal cell determination unit 413, a mask information generator 414, and a mode controller 415. The memory controller 410 may include a processor for controlling an overall operation of the memory controller 410 and may further include a working memory for temporarily storing various programs related to a memory operation control. The memory device 420 may include a memory cell array 421, a write/read circuit 422, and a control logic 423.

The memory controller 410 may provide the command CMD and the address ADD for the write operation for one region of the memory device 420 (for example, the first page). In addition, the memory device 420 may read data from the first page and provide the read data DATA_R to the memory controller 410.

The ECC circuit 411 may perform an error detection and a correction operation for the read data DATA_R and generate an error detection result. In addition, the data comparator 412 may compare a bit value of the write data DATA_W to be provided to the memory device 420 to a bit value of the read data DATA_R read from the memory device 420. In addition, the marginal cell determination unit 413 may determine the marginal cells among the memory cells of the first page by using the read data DATA_R according to the above-described embodiments. In addition, based on an operation result of the ECC circuit 411, the data comparator 412, and the marginal cell determination unit 413, the mask information generator 414 may generate mask information Info_Mask indicating locations of memory cells in which data is not to be written. In addition, the mode controller 415 may control the DCW mode of the memory device 420 according to the embodiments described above, and it is assumed that the DCW mix DCW_MIX mode is set for the memory device 420 in the embodiment illustrated in FIG. 13.

The memory controller 410 may provide the write data DATA_W and the mask information Info_Mask to the memory device 420, and the memory device 420 may perform the data write operation in response thereto. As an example, when the memory cells corresponding to a value of logic "1" in the mask information Info_Mask are masked, the write operation may be selectively performed for the memory cells corresponding to a value of logic "0" in the mask information Info_Mask.

The mask information generator 414 may generate the mask information Info_Mask based on various determination criteria. According to the operation of the mask information generator 414, data may be written for the memory cells according to various criteria in the DCW mix DCW_MIX mode, that is, according to either the DCW on DCW_ON mode or the DCW off DCW_OFF mode. An example of generating the mask information Info_Mask is described with reference to FIGS. 14A, 14B, and 14C.

Figure 14A:
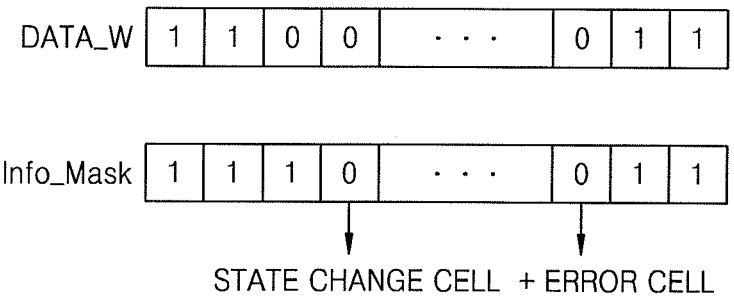

FIG. 14A illustrates an example in which memory cells where logic states are to be changed (or, data of different bit values is to be written) are not masked, and at the same time, memory cells in which errors have occurred according to an error detection result of the ECC circuit 411 are not masked. When an error has occurred in a memory cell, data characteristics may be determined to be relatively poorer than the other memory cells. Accordingly, the data write operation may be performed on the memory cell in which an error has occurred regardless of a bit value thereof. In other words, the memory cells in which errors have occurred may be included in the first region to which the DCW off DCW_OFF mode in the above-described embodiment is applied.

Figure 14B:
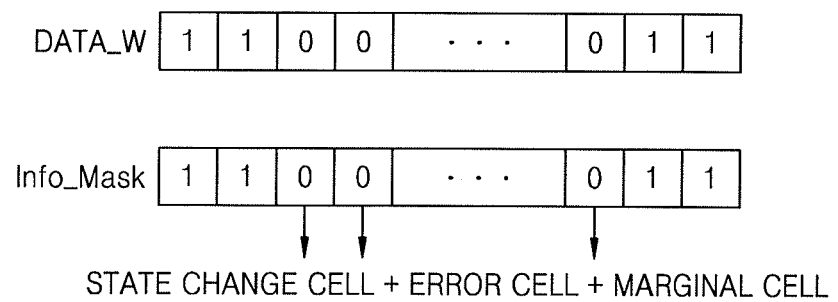

On the other hand, FIG. 14B illustrates an example in which the memory cells in which logic statuses are to be changed and the memory cells in which errors have occurred are not masked, and at the same time, the marginal cells according to the above-described embodiments are not masked. For example, the marginal cells may be defined as cells including memory cells that have a particular range of resistance levels, and some of the memory cells in which errors have occurred may correspond to the marginal cells, and the other memory cells may not correspond to the marginal cells. In other words, the memory cells in which errors have occurred may be included in the first region to which the DCW off DCW_OFF mode in the above embodiment is applied.

Figure 14C:
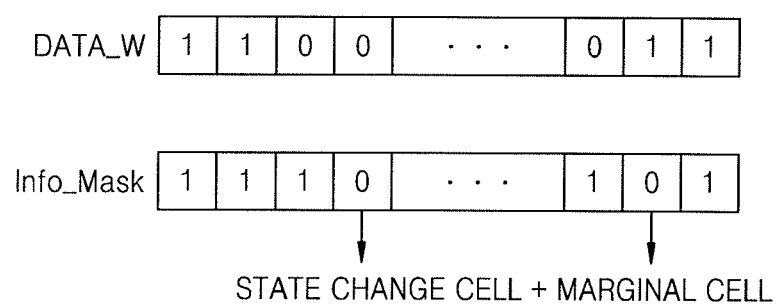

FIG. 14C illustrates an example in which the memory cells in which logic statuses are to be changed are not masked, and at the same time, the marginal cells are not masked. In other words, in FIG. 14C, the write operation may be selectively performed to some of the memory cells, in which errors have occurred, based on the data comparison result according to the DCW on DCW_ON mode, without including them in the first region the memory cells.

Figure 15:
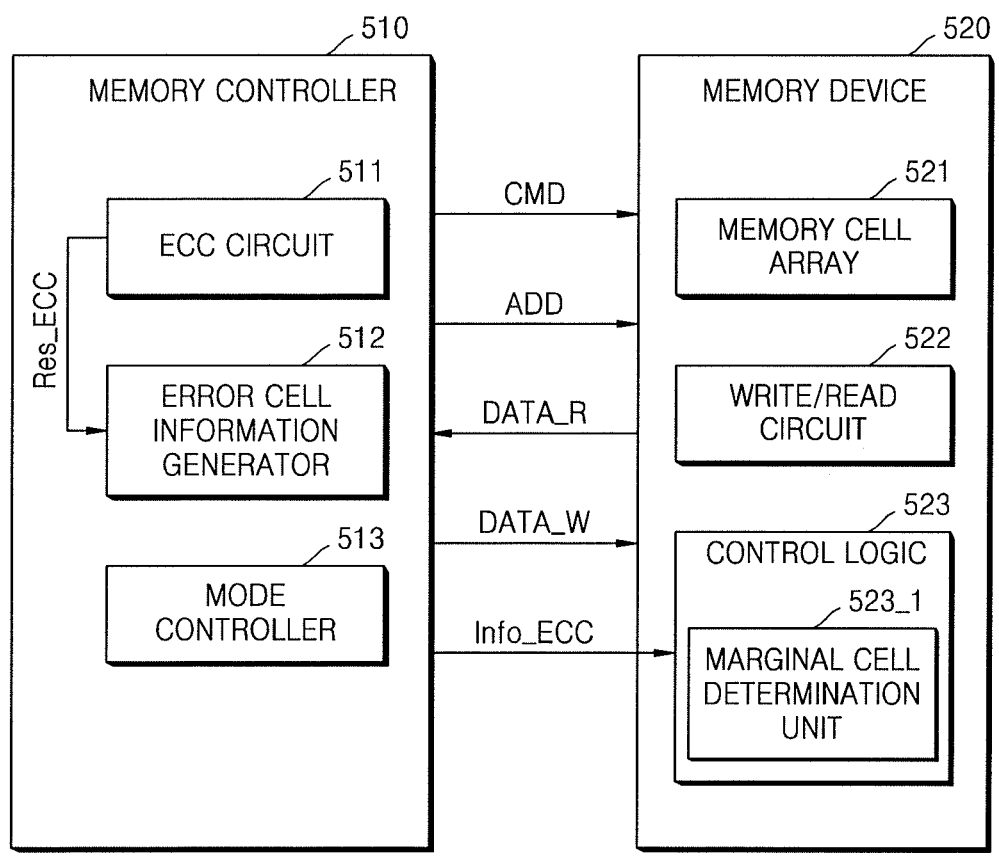
FIG. 15 illustrates an example of selecting memory cells to which a DCW off mode is applied based on a combination of determinations of a memory controller and a memory device.

FIG. 15 illustrates an example of selecting memory cells to which the DCW off DCW_OFF mode is applied based on a combination of determinations of a memory controller 510 and a memory device 520.

Referring to FIG. 15, a memory system 500 may include the memory controller 510 and the memory device 520. The memory controller 510 may include an ECC circuit 511, an error cell information generator 512, and a mode controller 513. In addition, the memory device 520 may include a memory cell array 521, a write/read circuit 522, and a control logic 523, and the control logic 523 may include a marginal cell determination unit 523_1.

According to an embodiment, data may be written according to the DCW off DCW_OFF mode for the marginal cells and the memory cells in which errors have occurred, and accordingly, masking may not be performed for the marginal cells and the memory cells in which errors have occurred. The ECC circuit 511 may perform an error detection operation and a correction operation on the read data DATA_R according to the above-described embodiment, and may provide an error detection result Res_ECC to the error cell information generator 512. In addition, the error cell information generator 512 may generate and output error cell information Info_ECC that indicates a location of a memory cell, in which an error has occurred among a plurality of memory cells, based on the error detection result Res_ECC.

The marginal cell determination unit 523_1 may determine the marginal cells according to the above-described embodiments. The control logic 523 may determine memory cells (for example, memory cells in the first region) to which data is to be written according to the DCW off DCW_OFF mode, based on the result of determining the marginal cells and the error cell information Info_EC. In addition, the memory cells may be determined in which data values are to be changed by a data comparison operation in the memory controller 510 or the memory device 520, and the control logic 523 may write data to the memory cells in the second region according to the DCW on DCW-ON mode.

Figure 16:
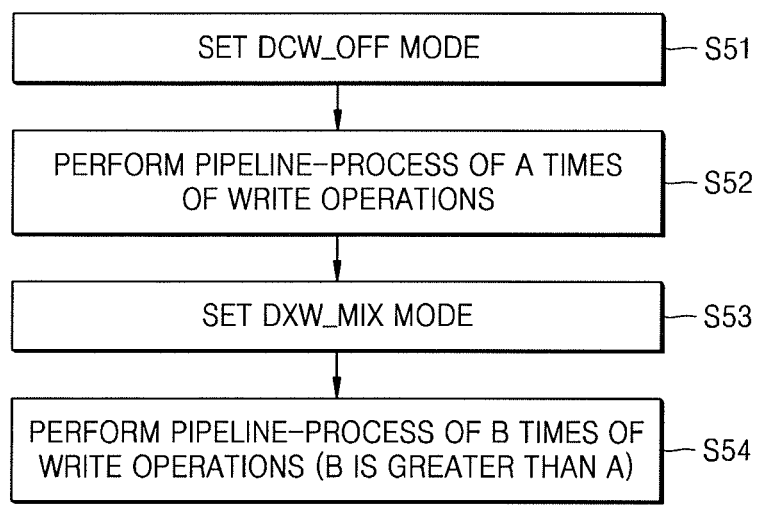
FIG. 16 illustrates a flowchart of an example of simultaneously writing different numbers of memory cells for each DCW mode, according to an example embodiment.

FIG. 16 is a flowchart of an example of simultaneously writing different numbers of memory cells for each DCW mode, according to an example embodiment.

Referring to FIG. 16, the DCW mode of a memory device may be set based on the control of a memory controller. In one example, the memory device may be set to the DCW off DCW_OFF mode (S51). When operating in the DCW off DCW_OFF mode, the memory device may perform the data write operation on all the memory cells of the cell region (for example, a page) to be written regardless of a change of the data value. As an example of operation, the memory device may perform the write operations on a plurality of (for example, A of) pages in a pipeline manner (S52). At this time, as a plurality of write operations overlap, the write operations for A of pages may be performed simultaneously.

On the other hand, the memory device may change the DCW mode based on the control of the memory controller, and as an example, may change the DCW mode to the DCW mix DCW_MIX mode (S53). As the DCW mode is changed to the DCW mix DCW_MIX mode, the memory device may not perform the actual write operation on some of the memory cells of the page to be written, and the memory device may perform a plurality of (for example, B of, where B is a natural number) write operations in the pipeline manner (S54). At this time, the write operation for B of pages may be performed simultaneously.

The number B of pages in which data is recorded simultaneously in the DCW mix DCW_MIX mode may be greater than the number A (where A is a natural number) of pages in which data is recorded simultaneously in the DCW off DCW_OFF mode. In other words, there may be a limit on the number of memory cells in which the write operation is simultaneously performed due to the amount of power that is supported by the memory device. At this time, the number of memory cells in which the actual write operation is performed in any one of the pages may be further less in the DCW mix DCW_MIX mode, and accordingly, the write operation may be simultaneously performed on more pages in the DCW mix DCW_MIX mode.

Figure 17A:
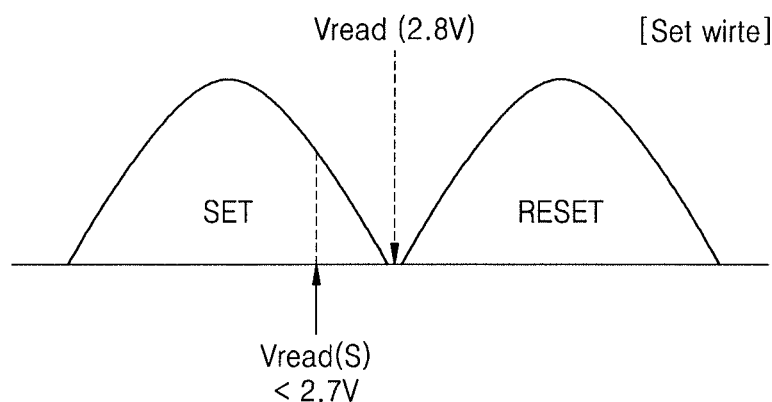
FIGS. 17A and 17B are graphs of examples of an operation of a memory, according to example embodiments, respectively.
Figure 17B:
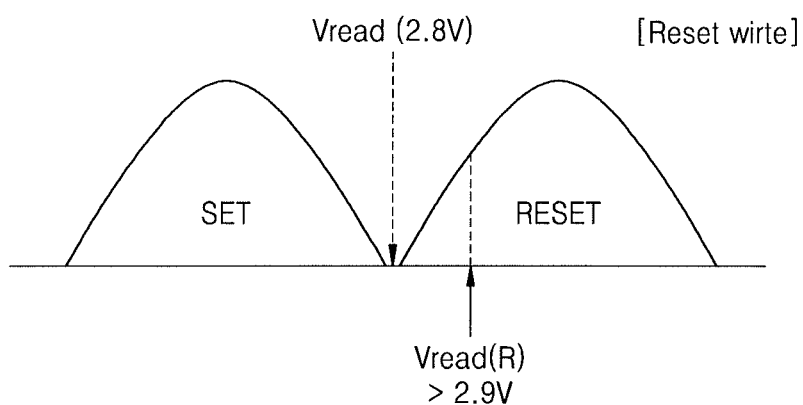

FIGS. 17A and 17B are graphs of examples of an operation of a memory, according to example embodiments, respectively.

In FIGS. 17A and 17B, an example of a normal read voltage Vread at a data read operation is illustrated, the normal read voltage Vread may be about 2.8 V according to the example embodiments, and the memory cells at the set state SET and the memory cells at the reset state RESET may be determined by an on-cell/off-cell determination based on the normal read voltage Vread.

Referring to FIG. 17A, when the memory cells to be written are the memory cells in which the set state SET write operation is performed, data previously stored may be read by using a first read voltage Vread(S) having a level less than a level of the normal read voltage Vread at the data read operation.

In this case, when the DCW mix DCW_MIX mode is applied, and the memory cells to be written as the set state SET are located to the left of the first read voltage Vread(S) as a reference in the distribution graph illustrated in FIG. 17A, the actual write operation may be skipped, while the actual write operation may be performed when the memory cells are located to the right thereof in the distribution graph illustrated in FIG. 17A.

In addition, similar to this case, referring to FIG. 17B, when the memory cells to be written are the memory cells in which the reset state RESET write operation is performed, data previously stored may be read by using a second read voltage Vread(R) having a level greater than the level of the actual normal read voltage Vread.

Based on the determination of the read data, when the memory cells to be written as the reset state RESET are located on the right of the second read voltage Vread(R) as a reference in the distribution graph illustrated in FIG. 17B, the actual write operation may be skipped, while the actual write operation may be performed when the memory cells are located on the left thereof in the distribution graph illustrated in FIG. 17B.

In FIGS. 17A and 17B, examples are illustrated in which, for the DCW-based data write operation, the first read voltage Vread(S) has a value less than about 2.7 V and the second read voltage Vread(R) has a value greater than about 2.9 V. However, with respect to the DCW-based write operation, the values may be variously modified without being limited to these values.

Figure 18:
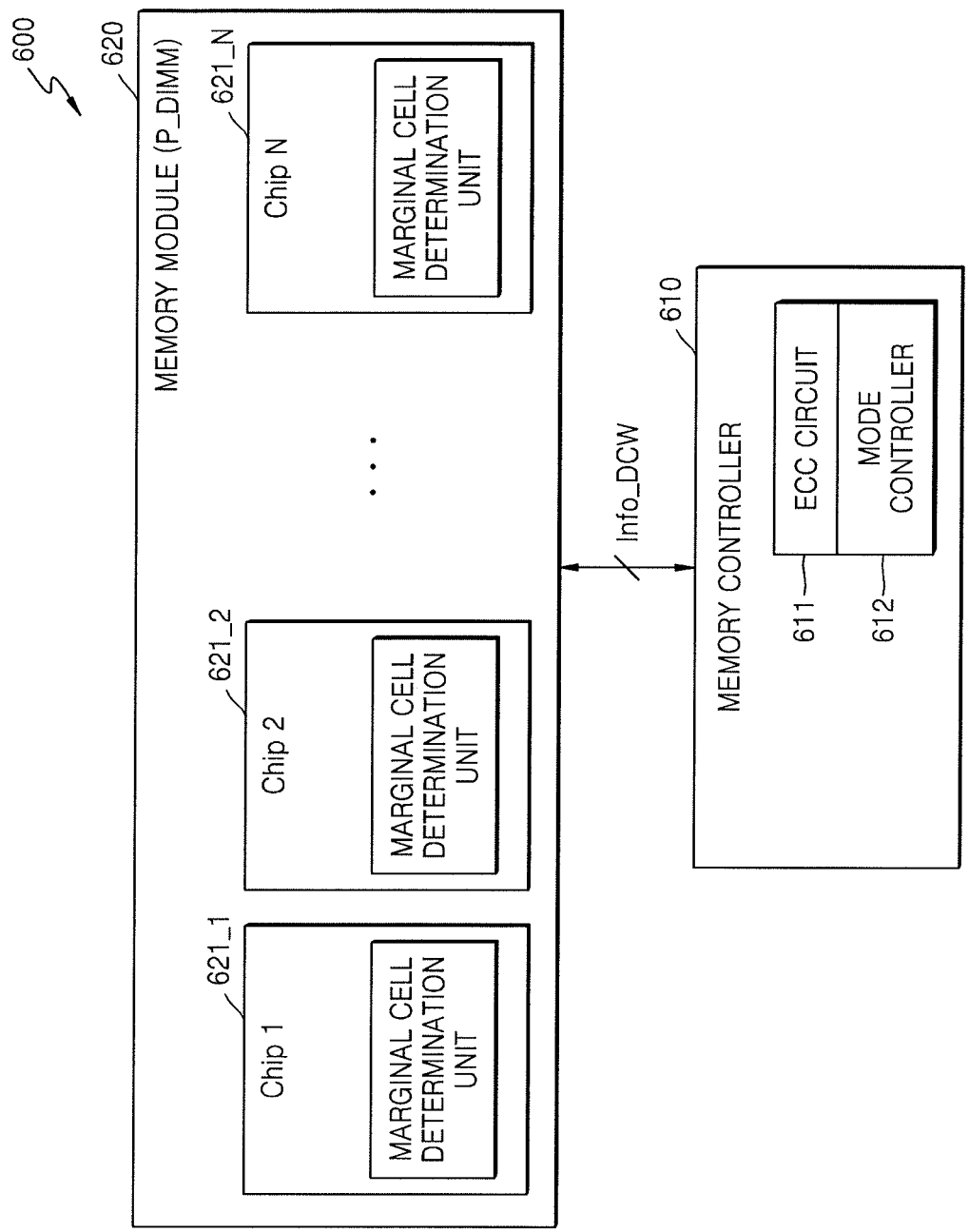
FIGS. 18 and 19 illustrate implementation examples of a memory system, according to various embodiments.
Figure 19:
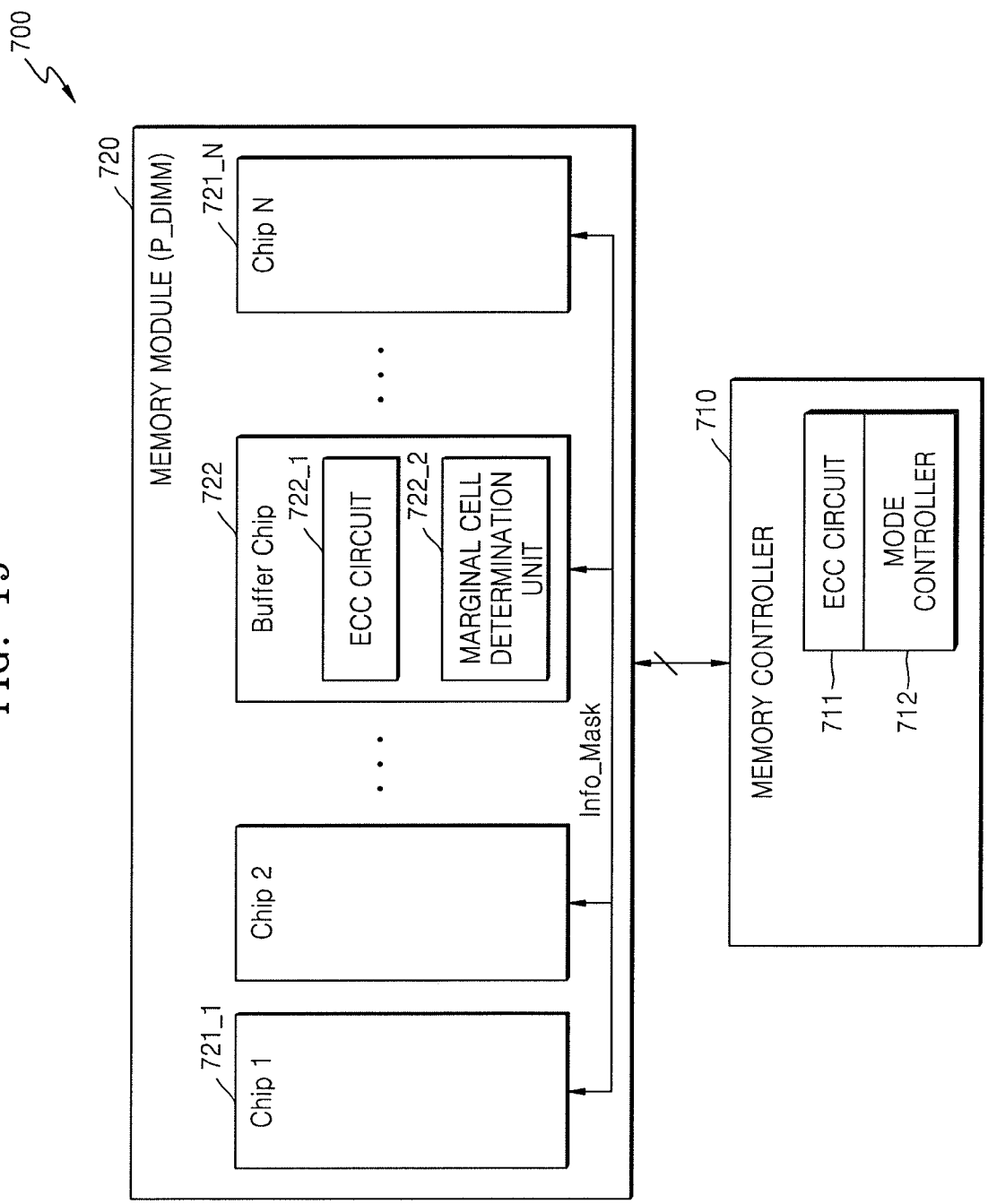

FIGS. 18 and 19 illustrate implementation examples of memory systems 600 and 700, according to various embodiments, respectively. FIGS. 18 and 19 illustrate an example in which the memory system 600 and 700 include a memory module 620 and 720, respectively, and the memory modules 620 and 720 may correspond to the memory device in the above-described embodiment or may include a plurality of memory devices in the above-described embodiment.

Referring to FIG. 18, a memory controller 610 may include an ECC circuit 611 and a mode controller 612. Although not illustrated in FIG. 18, the memory controller 610 may further include various other components such as a processor, a host interface (I/F), and a memory I/F, as components for controlling a memory operation.

The memory module 620 may include a plurality of memory chips mounted on a module board. As an example, the memory module 620 may include first through $N^{th}$ memory chips 621_1 through 621_N. In addition, each of the first through $N^{th}$ memory chips 621_1 through 621_N may correspond to the memory device in the above-described embodiments, and each of the first through $N^{th}$ memory chips 621_1 through 621_N may include a marginal cell determination unit. In addition, the memory controller 610 may provide the DCW information Info_DCW to the memory module 620 to set the DCW mode for the first through $N^{th}$ memory chips 621_1 through 621_N.

Each of the first through $N^{th}$ memory chips 621_1 through 621_N may operate in the DCW on DCW_ON mode, the DCW off DCW_OFF mode, or the DCW mix DCW_MIX mode based on the DCW information Info_DCW. When the first memory chip 621_1 operates in the DCW mix DCW_MIX mode, the marginal cells may be determined according to the above-described embodiments based on an operation of the marginal cell determination unit at the time of the write operation for the first memory chip 621_1, and since the DCW of DCW_OFF mode is applied to the marginal cells, the actual write operation may be performed on all the memory cells.

According to one embodiment, the DCW mode may be set in various units. As an example, as the DCW mode is set for each memory chip, any one memory chip may operate in a different DCW mode from the other memory chip. Alternatively, a plurality of cell units (for example, cell blocks) may be included in any one memory chip, and the DCW mode may be set differently for each cell unit of the memory chip.

In addition, according to one embodiment, the memory controller 610 may receive read data read from a page to be written, and the ECC circuit 611 may perform the error detection operation and the correction operation for the read data. In addition, the memory controller 610 may provide the error detection result to the memory module 620, and according to the above-described embodiment, data may be written according to the DCW off DCW_OFF mode for the memory cells in which errors have occurred.

In the above-described embodiment, the memory module 620 may be implemented in a form of a single in-line memory module (SIMM) or a dual in-line memory module (DIMM). In addition, the memory module 620 may correspond to various types of DIMMs, and for example, various types of DIMMs such as fully buffered (FB) FBDIMM and loaded reduced (LR) LRDIMM may be applied to the memory module 620. Alternatively, the memory module 620 may correspond to nonvolatile DIMM (NVDIMM) equipped with a nonvolatile memory (for example, a flash memory) to compensate for a problem of a volatile memory in which data is lost when a power supply is terminated.

In addition, as various types of modules, when the memory module 620, as one of various types of modules, includes phase-change random-access memory (RAM) (PRAM) as a resistive memory, the memory module 620 may be referred to as phase-change DIMM (P_DIMM). When the memory module 620 includes cross point (XPoint) memory chips including three-dimensional (3D)-type resistive memory cells, the memory module 620 may be referred to as XPoint DIMM (or 3D XPoint DIMM), and so forth.

Referring to FIG. 19, the memory system 700 may include a memory controller 710 and a memory module 720, and the memory controller 710 may include an ECC circuit 711 and a mode controller 712. In addition, the memory module 720 may include first through $N^{th}$ memory chips 721_1 through 721_N, and a buffer chip 722. The buffer chip 722 may include an ECC circuit 722_1. The buffer chip 722 may be mounted on the memory module 720 to perform various functions. For example, the buffer chip 722 may include a storage circuit (not illustrated) for temporarily storing commands and addresses through communication with the memory controller 710. In addition, the buffer chip 722 may receive write data and read data, and perform the error detection operation and the correction operation on read data provided from the first through $N^{th}$ memory chips 721_1 through 721_N.

When the DCW mix DCW_MIX mode is set, an operation of determining the memory cells to which the DCW on DCW_ON mode and the DCW off DCW_OFF mode are applied may be performed in various devices in the memory system 700. As an example, an operation of determining the memory cells having different values of the read data and write data may be performed in each of the first through $N^{th}$ memory chips 721_1 through 721_N, or may be performed in the buffer chip 722.

In addition, the operation of determining the marginal cells according to the above-described embodiments may be performed in each of the first through $N^{th}$ memory chips 721_1 through 721_N or may be performed in the buffer chip 722. An example is illustrated in FIG. 19 in which an operation of determining the marginal cells in the buffer chip 722 is performed as the buffer chip 722 includes a marginal cell determination unit 722_2.

On the other hand, the buffer chip 722 may further determine the memory cells to which the DCW off DCW_OFF mode is applied based on the error detection operation, and based on at least one of the comparison result of the data, the determination result of the marginal cell, and the error detection result of the marginal cell, the mask information Info_Mask may be generated. Each of the first through $N^{th}$ memory chips 721_1 through 721_N may selectively perform the write operation for the memory cells that are not masked by the mask information Info_Mask.

One or more embodiments provides a memory device capable of reducing the possibility of data reliability degradation that may occur during a data write according to a data comparison write (DCW) mode, and a memory system including the same.

In addition, according to a memory device and a memory system including the same according to one or more embodiments, power consumed at the time of writing data may be reduced as compared with the case where the DCW mode is not applied and, at the same time, the number of memory cells that are simultaneously written may be increased.

Embodiments are described, and illustrated in the drawings, in terms of functional blocks, units, modules, and/or methods. Those skilled in the art will appreciate that these blocks, units, modules, and/or methods are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units, modules, and/or methods being implemented by microprocessors or similar, they may be programmed using software (e.g., microcode) to perform various functions discussed herein and may optionally be driven by firmware and/or software. Alternatively, each block, unit, module, and/or method may be implemented by dedicated hardware, or as a combination of dedicated hardware to perform some functions and a processor (e.g., one or more programmed microprocessors and associated circuitry) to perform other functions. Also, each block, unit, and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A memory device, comprising:
   a memory cell array including a plurality of memory cells; and
   a control logic to control a write operation on the memory cell array in a first data comparison write (DCW) mode, such that, when operating in the first DCW mode,
   data is written to first memory cells in which data values are changed,
   in a first region, data is written to second memory cells of the plurality of memory cells in which data values are not changed, and
   in a second region, data is not written for second memory cells of the plurality of memory cells in which data values are not changed.

2. The memory device as claimed in claim 1, wherein the control logic is to set a write mode of the memory device to any one of the first DCW mode, a DCW on mode, and a DCW off mode, according to DCW information provided from a memory controller.

3. The memory device as claimed in claim 2, wherein, when the write mode of the memory device is set to the DCW on mode, the control logic is to control the write operation such that data is written to first memory cells in which data values are changed and data write is skipped for second memory cells in which the data values are not changed.

4. The memory device as claimed in claim 2, wherein, when the write mode of the memory device is set to the DCW off mode, the control logic is to control the write operation such that data is written to all memory cells regardless of a change of data value.

5. The memory device as claimed in claim 2, wherein the memory device is to receive the DCW information from the memory controller during an initialization operation, and the write operation is performed according to the write mode set at the initialization operation.

6. The memory device as claimed in claim 2, wherein the memory device is to receive the DCW information each time a data write request is received from the memory controller, and the write operation is performed according to the write mode corresponding to the received DCW information in response to each data write request.

7. The memory device as claimed in claim 1, wherein the control logic includes a marginal cell determination unit for determining marginal cells having relatively low data reliability among memory cells and the control logic is to include the marginal cells in the first region.

8. The memory device as claimed in claim 7, wherein the marginal cell determination unit is to receive first read data read from the memory cell array using a first read level and second read data read from the memory cell array using a second read level, and determine memory cells of the plurality of memory cells in which bit values are different when read using the first read level and when read using the second read level as marginal cells.

9. The memory device as claimed in claim 1, wherein the memory cell array includes a plurality of pages, each page corresponds to a data write unit, and data is written to some memory cells in which data values are not changed in one of the plurality of pages.

10. The memory device as claimed in claim 1, wherein the memory device is to provide read data read from the memory cell array to a memory controller and receive information indicating memory cells of the plurality of memory cells in which errors have occurred as marginal cells from the memory controller, and the control logic is to include the marginal cells of the plurality of memory cells having errors in the first region.

11. The memory device as claimed in claim 1, wherein the control logic is to set a write mode of the memory device to the first DCW mode or a DCW off mode based on control of a memory controller, and a number of cell regions that are simultaneously written when the first DCW mode is set is greater than a number of cell regions that are simultaneously written when the DCW off mode is set.

12. A memory device, comprising:
a memory cell array including a plurality of pages, each page including a plurality of memory cells; and
a control logic to control a data write operation according to a mode selected from a data comparison write (DCW) on mode, a DCW off mode, and a DCW mix mode for the memory cell array,
wherein, when the DCW mix mode is selected, the control logic is to write data according to the DCW off mode for a first region of memory cells of the plurality of memory cells of a first page to which a data write is requested and write data according to the DCW on mode for a second region of memory cells of the plurality of memory cell of the first page.

13. The memory device as claimed in claim 12, wherein the control logic is to write data to memory cells of the first region regardless of a change of a data value and selectively write data to memory cells in the second region in which data values are changed.

14. The memory device as claimed in claim 12, wherein the control logic is to include memory cells having a relatively low data reliability among the plurality of memory cells of the first page in the first region.

15. The memory device as claimed in claim 14, wherein the control logic is to receive first read data read from the first page using a first read level and second read data read from the first page using a second read level, and include memory cells having different bit values in the first region.

16. The memory device as claimed in claim 14, wherein the memory device is to provide read data read from the first page to a memory controller and receive, from the memory controller, first information indicating memory cells in which errors have occurred, and the control logic is to include the memory cells in which the errors have occurred in the first region.

17. A memory system, comprising:
a memory device including a memory cell array including a plurality of memory cells;
a control logic to control data write and data read on the memory cell array; and
a memory controller to control a memory operation of the memory device and provide the memory device with data comparison write (DCW) information for setting a write mode of the memory device,
wherein, when a DCW mix mode is set as the write mode, the memory device is to write data to a first region of memory cells of the plurality of memory cells of the memory cell array according to a DCW off mode regardless of a change of a data value and to selectively write data according to a DCW on mode to a second region of memory cells of the plurality of memory cells of the memory cell array in which data values are changed.

18. The memory system as claimed in claim 17, wherein the memory device is to write, for a first page of the memory cell array, data according to the DCW off mode for the first region of the first page and write data according to the DCW on mode on the second region of the first page.

19. The memory system as claimed in claim 18, wherein the memory controller includes a marginal cell determination unit to receive first read data read from the first page using a first read level and second read data read from the first page using a second read level, and assign cells in which bit values are different to the first region.

20. The memory system as claimed in claim 18, wherein the memory controller includes an error correction code (ECC) circuit to receive data read from the first page and detect locations of memory cells in which errors have occurred, and assign memory cells in which the errors have occurred to the first region.

* * * * *